United States Patent
Tadeparthy (10) Patent No.: US 7,675,315 B2
(45) Date of Patent: Mar. 9, 2010

(54) OUTPUT STAGE WITH LOW OUTPUT IMPEDANCE AND OPERATING FROM A LOW POWER SUPPLY

(75) Inventor: Preetam Charan Anand Tadeparthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/306,768

(22) Filed: Jan. 10, 2006

(65) Prior Publication Data

US 2007/0194809 A1   Aug. 23, 2007

(51) Int. Cl.
H03K 17/16 (2006.01)
H03K 19/094 (2006.01)
(52) U.S. Cl. .............................. 326/30; 326/83; 326/87
(58) Field of Classification Search .................. 326/82, 326/83, 86, 87; 327/108, 109
See application file for complete search history.

(56) References Cited

U.S. PATENT DOCUMENTS

| | | | | |
|---|---|---|---|---|
| 4,866,301 A | * | 9/1989 | Smith | 327/60 |
| 4,888,498 A | * | 12/1989 | Kadakia | 327/546 |
| 5,317,218 A | * | 5/1994 | Liu | 365/185.21 |
| 5,886,547 A | * | 3/1999 | Durec et al. | 327/113 |
| 2003/0052717 A1 | * | 3/2003 | Kakitani | 327/94 |
| 2006/0208790 A1 | * | 9/2006 | Tadeparthy et al. | 327/541 |
| 2007/0085580 A1 | * | 4/2007 | Singh et al. | 327/158 |

* cited by examiner

Primary Examiner—Rexford N Barnie
Assistant Examiner—Thienvu V Tran
(74) Attorney, Agent, or Firm—William B. Kempler; Wade J. Brady, III; Frederick J. Telecky, Jr.

(57) ABSTRACT

A low-impedance output stage which operates from a low voltage power supply. In an embodiment, the output stage contains an operational amplifier and two PMOS transistors used in a feedback configuration resulting in low output impedance. The output stage may also include a capacitor connected between the output terminal of the output stage and the input of the PMOS transistor providing the output, resulting in an overall output impedance which remains low even at higher frequencies, thus enabling use of the output stage to drive capacitive loads without causing resonance.

13 Claims, 6 Drawing Sheets

OUTPUT STAGE WITH LOW OUTPUT IMPEDANCE AND OPERATING FROM A LOW POWER SUPPLY

BACKGROUND

1. Field of the Invention

The present invention relates generally to the design of electronic circuits, and more specifically to a low-output-impedance circuit operating from a low supply voltage.

2. Related Art

An output stage generally refers to a portion of a circuit which provides the output signals of interest on corresponding output terminals. The terminals may connect the output stage with the input stage of a subsequent circuit (or to a load in general). The output stage is characterized by an output impedance, which is in theory defined as the impedance seen looking into the terminals.

It is generally desirable that the output impedance be low since the signal strength (voltage, current) would then be available for the actual load that the electrical circuit may be designed to be connected to. Low output impedance can lead to several benefits such as reduced power consumption, potential simplification of circuit design, etc., as is also well known in the relevant arts.

Output stages generally operate from a power supply. The power supply provides the energy (in the form of voltage/current) to generate the output signals. For example, a supply voltage, often termed as Vdd, is provided in operation of several circuits.

It may be desirable to provide output stages with low output impedance which operate from low power supplies in several environments. For example, there is an increasing demand to implement circuits operating with lower supply voltages (e.g., from 3.0 to 1.8 Voltage), and it may thus be desirable to ensure that the output stage also can operate at corresponding low supply voltage.

Various aspects of the present invention address one or more of the above-noted requirements, as described below in further detail.

BRIEF DESCRIPTION OF THE DRAWINGS

The present invention will be described with reference to the following accompanying drawings, which are described briefly below.

FIG. (FIG.) 1 is a block diagram illustrating an example environment in which various aspects of the present invention can be implemented.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An output stage provided according to an aspect of the present invention includes an amplifier and two transistors coupled in a manner such that the output stage provides a low output impedance and operates from a low power supply. In an embodiment, the output stage contains an operational amplifier driving a gate terminal of a first MOS transistor, ensuring that there is no loading of the operational amplifier. The output of the output stage is provided at the drain terminal of a second MOS transistor, and the source and bulk (substrate) terminals of the second MOS transistor are substantially at the same potential. This enables the use of a low power supply and further, the output voltage of the output stage to be substantially independent of the power supply. A feedback path is provided from the output (drain) terminal of the second MOS transistor to the drain terminal of the first MOS transistor. Such an active feedback connection ensures that stability of the circuit is maintained.

According to another aspect of the present invention, a capacitor is provided between the output terminal of the output stage and the input terminal of the last transistor. As a result, at higher frequencies, the feedback factor is reduced, thereby increasing gain in the last transistor. This, to a certain extent, increases the local loopgain, and consequently compensates increase in output impedance at higher frequencies.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention

2. Example Environment

Figure 1:
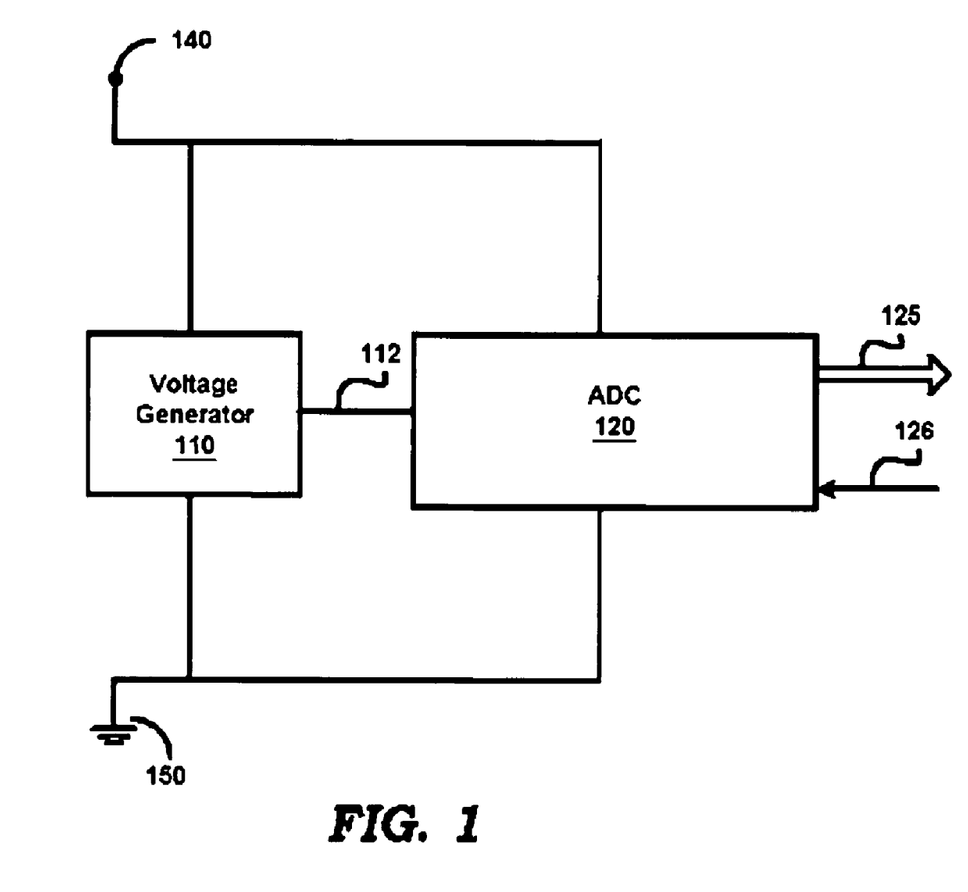

FIG. 1 is a block diagram of an example environment in which various aspects of the present invention can be implemented. FIG. 1 is shown containing voltage generator 110 and analog-to-digital converter (ADC) 120. The blocks may be used as a part of a data acquisition system or instrumentation or control system. Such systems typically have other elements (blocks, not shown) to process the digital data received on path 125 and to control various functions such as sampling times and sampling rates, etc.

ADC 120 converts analog signals received on path 126, to equivalent digital representations according to the reference voltage received on path 112. The digital representations (digital codes) are made available on path 125 to an external system (such as a microprocessor, not shown). ADC 120 may be implemented as any of several different types of ADCs, such as successive approximation (SAR) ADC, integrating type ADC, pipelined ADC etc.

Voltage generator 110 provides a stable reference voltage output to ADC 120 on path 112. Power and ground connections to the various blocks shown are represented by 140 and 150 respectively.

The accuracy with which ADC 120 converts an input analog signal to an equivalent digital code depends, among other factors, on the accuracy of the reference voltage on path 112. One of the parameters that determines accuracy of the reference voltage is load regulation, which is a measure of the change in the output reference voltage due to a change in the current drawn from voltage generator 110.

This parameter depends on the output impedance of voltage generator 110. The lower the output impedance, the less change in output voltage due to variations in load current (and hence greater accuracy in reference voltage), and vice versa. Accordingly, it may be desirable to design voltage generator 110 with a low output impedance.

Further, it may be desirable, for reasons such as lower power consumption, that all the blocks in a system referred to above operate from a low power supply voltage. As such, it is also desirable that voltage generator 110 be able to operate from a low power supply voltage, while still being able to provide a reasonably wide range of reference voltages.

Various aspects of the present invention meet one or more of such objectives. The features of the present invention can be appreciated in comparison to a prior approach using which output stages are implemented. Accordingly, the next section contains the description of a prior approach to such a circuit.

3. Prior Output Stage

Figure 2:
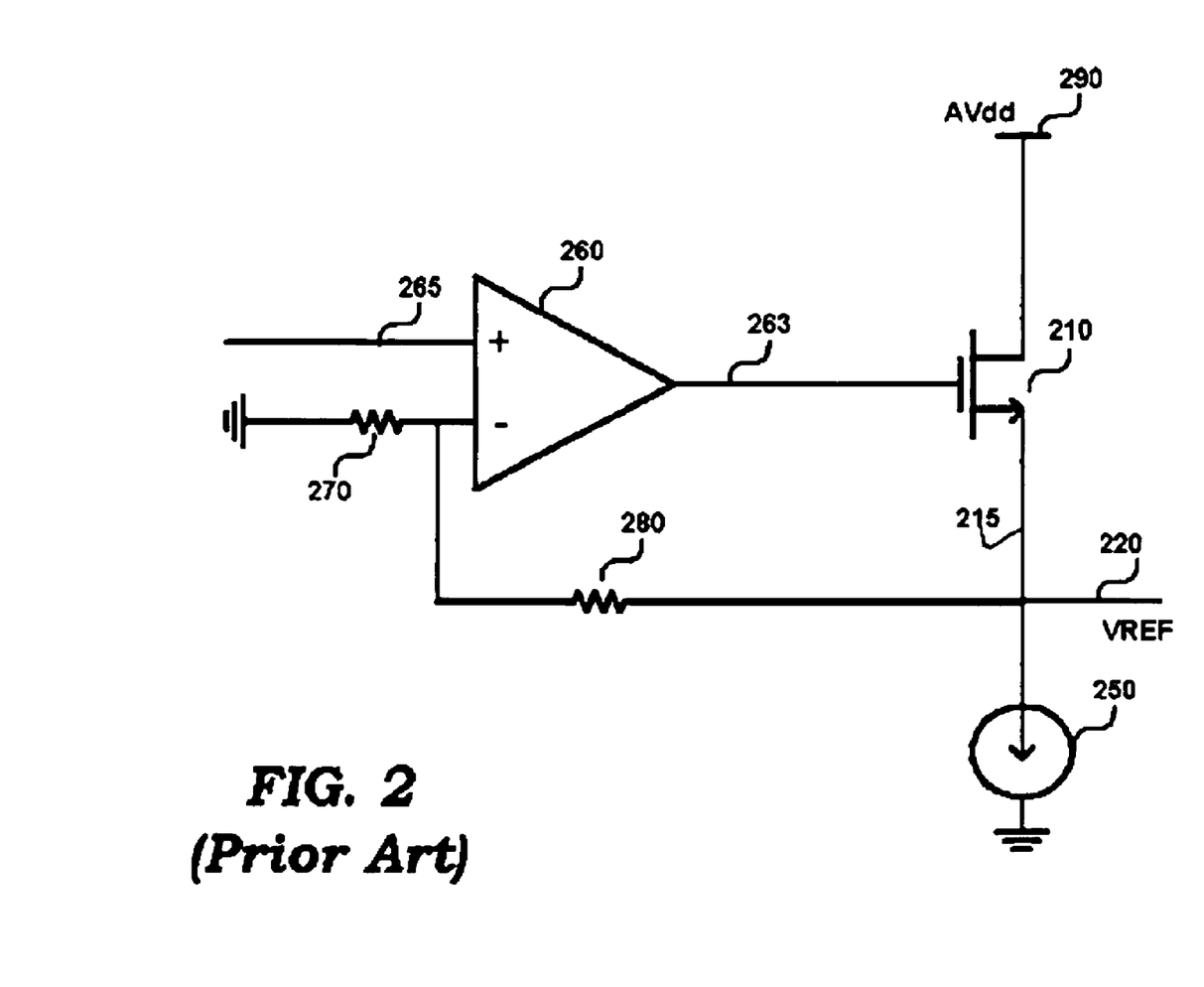
FIG. 2 is a schematic diagram of a prior output stage.

FIG. 2 is a schematic representation of a prior output stage that provides a low output impedance. The output stage is shown containing operational amplifier (OPAMP) 260, N-channel MOSFET (NMOS) 210, current source 250 and resistors 270 and 280. Each component is described below in further detail.

OPAMP 260 is used in a closed-loop configuration and produces an amplified voltage (on path 263) of an input voltage received on path 265. The gain of OPAMP 260 is determined by resistors 270 and 280. The output terminal of OPAMP 260 is connected to the gate terminal of NMOS210.

NMOS 210 is used in a source follower configuration and operates to reduce the output impedance compared to if the output were given directly from path 263. The output (VREF) is taken from the source terminal (220) of NMOS 210. The gate terminal of NMOS 210 is connected to the output of OPAMP 260.

Current source 250 provides a constant current on path 215, and helps in maintaining a stable voltage output (VREF) at point 220. The source follower configuration of NMOS 210 provides a low output impedance, equal to $1/g_m$, wherein $g_m$ is equal to the transconductance of NMOS 210.

As NMOS 210 is used in a feedback configuration with OPAMP 260, the output impedance is reduced by a factor equal to the open-loop gain of OPAMP 260, as is well known in the relevant arts.

That is, the output impedance of output stage shown in FIG. 1 is given by:

$$Z_o = 1/(g_m * A_o) \quad \text{Equation 1}$$

wherein:
$Z_o$ is the output impedance of the output stage,
$g_m$ is the transconductance of NMOS 210
and $A_o$ is the open-loop gain of OPAMP 260.

One disadvantage with the output stage shown in FIG. 2 is that it requires a comparatively high value of supply voltage for operation. Specifically, the minimum value of supply voltage $AV_{dd}$ is governed by the following mathematical relation:

$$AV_{dd} > VREF + V_{TN} + 3V_{ON} \quad \text{Equation 2}$$

wherein:
$AV_{dd}$ is the minimum required value of supply voltage 290
VREF is the value of the reference voltage output
$V_{TN}$ is the threshold voltage of the NMOS transistor
$V_{ON}$ (the minimum voltage needed to keep the transistors in saturation) represents a voltage difference between the operating voltage across the gate and source terminals (Vgs) of transistor 210 and $V_{TN}$ i.e (Vgs−$V_{TN}$). $V_{ON}$ also represents the difference (Vgs−$V_{TN}$) of each of two cascoded transistors (not shown) contained in OPAMP 260

> represents the greater-than logical relationship.

The substrate (bulk) terminal of NMOS 210 is tied to ground potential in one embodiment. From FIG. 2, it can be seen that the source terminal of NMOS 210 is at a potential higher than ground by a value VREF. Due to this reason, the threshold voltage $V_{TN}$ could be high (e.g., of the order of 1 volt). Further, $V_{ON}$ is approximately equal to 200 milli volts for a required VREF of 1 volt.

Therefore, to obtain a reference voltage (VREF) of 1 Volt, the minimum value of power supply voltage $AV_{dd}$ is given by:

$$AV_{dd} > 2.6V \quad \text{Equation 3}$$

Figure 3:
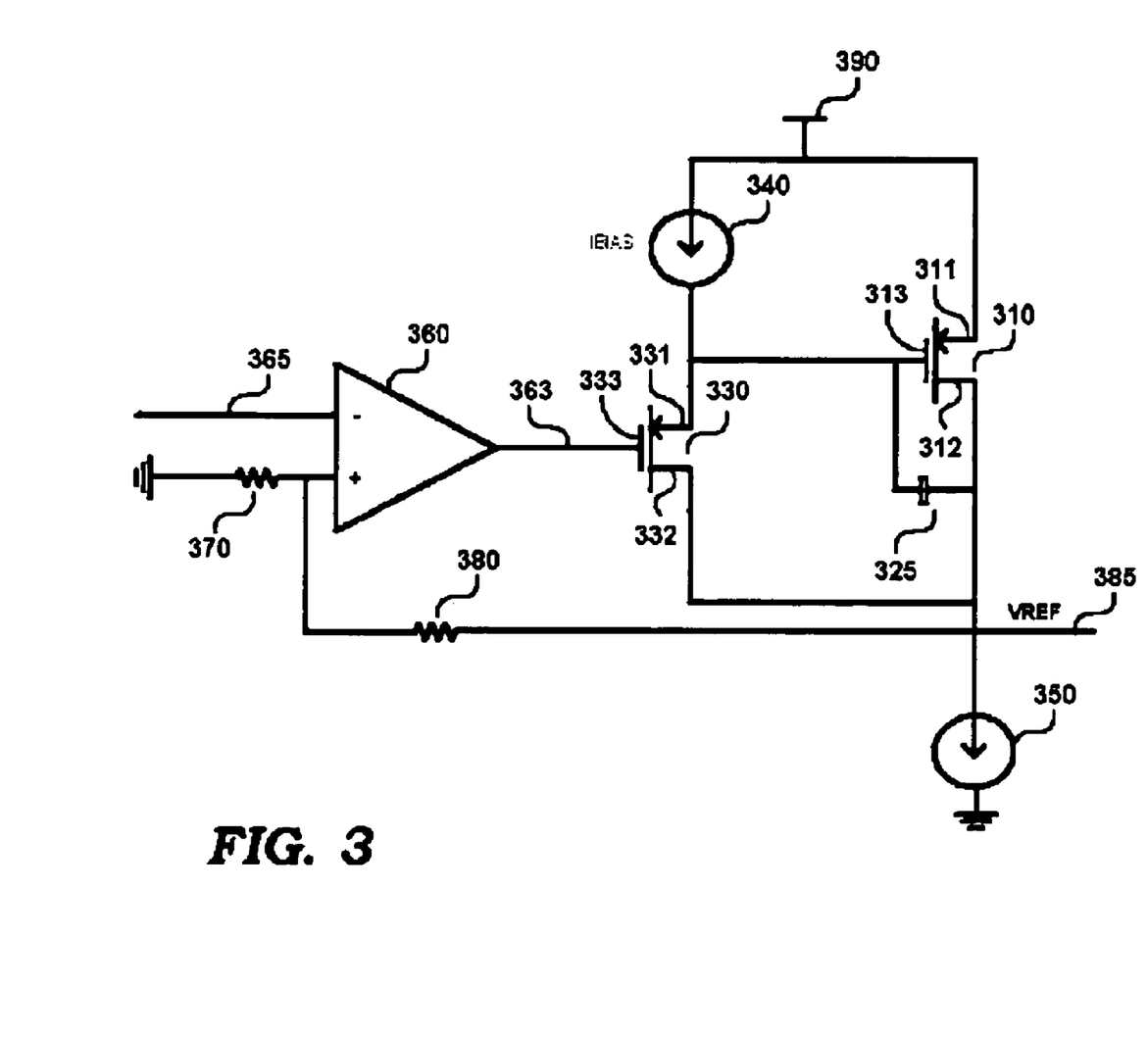
FIG. 3 is a schematic diagram of an output stage according to an aspect of the present invention.

(for the circuit of FIG. 3, where OPAMP 260 contains a cascode stage at its output.)

Providing an output voltage using a source follower stage as shown in FIG. 3, has the disadvantage that the range of output voltages is constrained by the bulk-bias ($V_{TN}$ of equation 2), as illustrated above using example values in equation 3. Although, FIG. 1 is shown using NMOS transistors, a source follower circuit using PMOS transistors may have similar limitations.

As noted earlier, it is desirable to operate integrated circuits from lower power supply voltages. Various aspects of the present invention provide a low-impedance output stage which can operate from lower supply voltages as described below in further detail.

4. Low Impedance Output Stage Operating from Low Power Supply

FIG. 3 is a schematic representation of an output stage according to an aspect of the present invention. The output stage is shown containing operational amplifier (OPAMP) 360, P-channel MOSFETs (PMOS) 310 and 330, current sources 340 and 350, and resistors 370 and 380. The output terminal of the output stage is on path 385 and provides a voltage (VREF).

OPAMP 360 is used in a closed-loop configuration and produces an amplified voltage (on path 363) of the input voltage received at its non-inverting terminal on path 365. The output terminal of OPAMP 360 is connected to the gate (input) terminal (333) of PMOS 330.

PMOS 330 has its gate terminal (333) connected to the output of OPAMP 360, source(output) terminal (331) connected to the gate (input) terminal (313) of PMOS 310 and drain terminal (332) connected to the output terminal 385. Current source 340 provides biasing (operating point) for PMOS 330.

PMOS 310 has its source terminal (311) connected to power supply (AVdd) 390, and drain terminal (312) connected to the output terminal 385. Current source 350 provides biasing (operating point) for PMOS 310.

Resistor 380 is connected between the output terminal 385 and the non-inverting input terminal of OPAMP 360. Resistor 370 is connected between the non-inverting input terminal of OPAMP 360 and ground. The two resistors cause OPAMP 360 to operate in the closed-loop configuration. Feedback is provided from output terminal 385 to drain terminal (332) of PMOS 330.

The topology described above operates as an output stage with low impedance, as described in sections below (described with respect to FIGS. 4 and 5).

Continuing with the description of FIG. 3, capacitor 325 is connected across the output 385 and gate terminal (313) of PMOS 310. As described below, the use of capacitor 325 reduces the feedback factor at higher frequencies, thus reducing the output impedance at higher frequencies. This offsets, to a certain extent, the gain reduction at higher frequencies in OPAMP 360, and consequently compensates for increase in output impedance at higher frequencies.

From FIG. 3, it may be appreciated that since the output of OPAMP 360 is connected to the gate terminal 333 of PMOS 330, OPAMP 360 is not loaded. The feedback provided by PMOS 330 to the gain stage formed by PMOS 310 prevents any circuit stability problems.

In comparison to the output stage of FIG. 2, it may be appreciated that since the output of FIG. 3 is provided between the drain terminal of PMOS 310 and ground, there is no dependence of the output voltage on bulk-bias effects (explained earlier). Thus, the output voltage may be chosen substantially independent of the supply voltage AVdd.

The circuit of FIG. 3 uses two PMOS transistors (330 and 310). It should be understood, that a circuit similar to that of FIG. 3, but using NMOS transistors (with appropriate changes in connections) can also operate as an output stage providing a low output impedance (as will be apparent to one skilled in the relevant arts by reading the disclosure herein).

The operation of the circuit of FIG. 3 using a low power supply is described below.

5. Lower Power Supply Voltages

The power supply voltage 390 (AVdd) for a required value of output (VREF) is given by:

$$AV_{dd} > VREF + V_{TP} + V_{ON1} + V_{ON2} \quad \text{Equation 4a}$$

wherein:

$AV_{dd}$ is the minimum required value of supply voltage

VREF is the value of the reference voltage output $V_{TP}$ is the threshold voltage of the PMOS transistors 310

$V_{ON1}$ represents a voltage difference between the operating voltage across the gate and source terminals (Vgs) of PMOS transistor 330 and $V_{TP}$ (in this case it is the minimum voltage to keep PMOS 330 in saturation).

$V_{ON2}$ represents a voltage difference between the operating voltage across the gate and source terminals (Vgs) of PMOS transistor 310 and $V_{TP}$.

As is well known, MOSFETs are characterized by a parameter commonly referred to as threshold voltage($V_T$), which is the minimum value of the voltage between the MOSFET (s gate and source terminals at which a drain current begins to flow, and the MOSFET may be used in normal operation. The threshold voltage for a PMOS transistor is lower than the corresponding threshold voltage for an NMOS transistor due to the fabrication process.

The threshold voltage $V_T$ is not a constant, but a function of the voltage ($V_{SB}$) between the source and substrate (bulk) terminals of a MOSFET. $V_T$ is minimum when $V_{SB}$ is zero, and increases for non-zero values of $V_{SB}$. When used in integrated circuits, the substrate terminals of PMOS transistors is normally connected to the power supply, while the substrate terminals of NMOS transistors is normally connected to the ground terminal.

The substrate (bulk) terminal (not shown in figure) of PMOS 310 is connected to power supply ($AV_{dd}$)390. The source terminals 311 of PMOS 310 is also connected to power supply 390. Consequently, the potential difference ($V_{SB}$) between source and bulk terminals of PMOS 310 is always 0 volts irrespective of output voltage at terminal 385. Therefore, the value of $V_{TP}$ in equation 4A is always the minimum specified for PMOS transistor 310, and further does not vary with the value of VREF desired. Similarly bulk of PMOS 330 may be connected to source terminal 331 to achieve a lower value of threshold voltage in the bias provided to PMOS 310.

In contrast, the output stage shown in FIG. 2 uses an NMOS transistor which has a higher value of threshold voltage $V_T$ due to additional implants during the fabrication process. Further, due to the source follower configuration (which is necessary to achieve a low output impedance), source terminal of NMOS transistor 210 is at a potential different from ground (to which the substrate terminal is connected). Due to the non-zero value of the potential difference($V_{SB}$) between source and bulk terminals of NMOS 210, the value of threshold voltage $V_T$ is higher than its minimum.

Therefore, it may be appreciated that the output stage of FIG. 3 has a lower power supply voltage requirement for the same value of output voltage VREF, as may be seen by comparing equations 3 and 4b and further illustrated below.

Substituting for typical values for the terms in equation 4a gives, $$AV_{dd} > VREF + 0.9V \text{ (A value of 0.5V for } V_{TP} \text{ and} \\ 0.2V \text{ for each of } V_{ON1} \text{ and } V_{ON2} \text{ have been used)} \quad \text{Equation 4b}$$

Thus for a VREF of 1 Volt, $AV_{dd} > 1.9V$, which is less than the requirement indicated by equation 3.

The substrate terminal (not shown in FIG. 3) of PMOS 330 is connected to its source terminal 331. Such a connection results in a minimum value of threshold voltage $V_{TP}$ for PMOS 330 and further helps in minimizing power supply voltage ($AV_{dd}$) requirement.

It may be seen that the constraint on a minimum value of power supply $AV_{dd}$ due to the bias to PMOS 310 (formed by PMOS 330 and current source 340) results in a value that is lower than 1.9V as determined from the equation below:

$$AV_{dd} > 2V_{ON}(360) + V_{TP}(330) + V_{ON}(330) + V_{TP}(310) + V_{ON}(310) \quad \text{Equation 4c}$$

Wherein $2V_{ON}(360)$ represents a factor due to the output transistorstage (not shown in FIG. 3) of OPAMP 360

$V_{TP}(330)$ is the threshold voltage of PMOS 330.

$V_{ON}(330)$ is a factor due to saturation voltage requirement of PMOS 330.

$V_{TP}(310)$ is the threshold voltage of PMOS 310.

$V_{ON}(310)$ is a factor due to saturation voltage requirement of PMOS 310.

It may be verified that the AVdd requirement as given in equation 4c is less than 1.9 Volts.

Thus, it may be appreciated that the circuit of FIG. 3 may operate from a low value of power supply voltage.

Further, as the potential difference($V_{SB}$) between source and bulk terminals of PMOS 310 of FIG. 3 is at a fixed minimum value (zero volts) irrespective of the output voltage VREF, the output voltage VREF can be chosen substantially independent of the supply voltage $AV_{dd}$.

The feedback used in the output stage shown in FIG. 3, results in a low output impedance as is shown below.

6. Low Output Impedance

Figure 4:
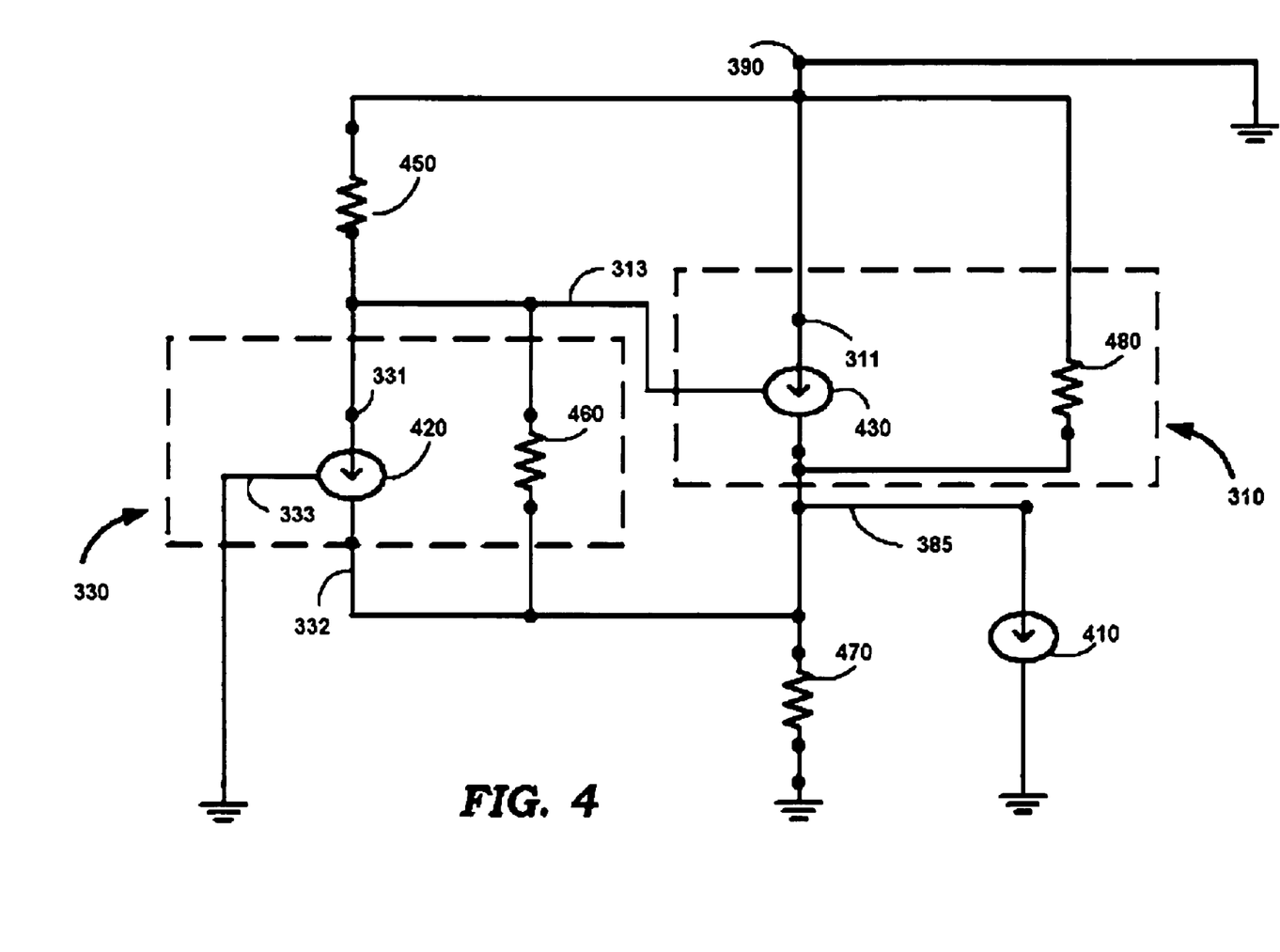
FIG. 4 is a schematic diagram illustrating the manner in which open loop output impedance of an output stage is computed in an embodiment.

FIG. 4 shows a schematic representation of the portion of output stage (of FIG. 3) containing PMOS transistors 310 and 330 and biasing current sources 340 and 350. For the sake of ease of description, OPAMP 360 is considered to be ideal and only the portion of the output stage containing elements 310, 330, 340 and 350 is used for computing the output impedance. In FIG. 4, PMOS 310 and 330 have been replaced by equivalent models in order to derive the parameters of interest.

Element 420 (representing the transconductance of PMOS 330) represents the source-to-drain current source according to the small signal model for PMOS 330. Resistor 460($R_{ds2}$) represents the equivalent source-to-drain resistance according to the small signal model for PMOS 330.

Element 430 (representing the transconductance of PMOS 310) represents the source-to-drain current source according to the small signal model for PMOS 310. Resistor 480 ($R_{ds1}$) represents the equivalent source-to-drain resistance according to the small signal model for PMOS 310.

Resistor 450 is the equivalent resistance presented by current source 340. Resistor 470 is the equivalent resistance presented by current source 350.

As is well known, for the purpose of computation of output impedance in a circuit, all independent voltage sources are shorted (made 0 volts). Therefore, in FIG. 4, power supply terminal 390 is shown connected to ground, and gate(input) terminal 333 of PMOS 330 is connected to ground, in order to compute the output impedance. Further a current source 410, supplying a current $I_{in}$ is connected to output terminal 385.

The description is now continued with respect to equations demonstrating that the model of FIG. 4 provides low output impedance. Various symbols and parameters used in deriving the output impedance are first given below:

$g_{m1}$ represents the transconductance of PMOS 310.

$g_{m2}$ represents the transconductance of PMOS 330.

$R_{ds2}$ represents the equivalent source-to-drain resistance according to the small signal model for PMOS 330.

$g_{ds2}=1/R_{ds2}$ $R_{ds1}$ represents the equivalent source-to-drain resistance according to the small signal model for PMOS 310.

$g_{ds1}=1/R_{ds1}$ $R_{dsb1}$ represents the resistance of current source 350(of FIG. 3) and is represented by element 470(of FIG. 4).

$g_{dsb2}=1/R_{dsb2}$ $R_{dsb2}$ represents the resistance of current source 340(of FIG. 3) and is represented by element 450(of FIG. 4).

$g_{dsb2}=1/R_{dsb2}$ $V_0$(terminal 385) represents the voltage at the output terminal of the output stage.

$V_x$(terminal 313) represents the voltage at the gate terminal 313 of PMOS 310.

$I_{in}$ represents the current from a current source 410 supplying a constant current connected on path 385. (This is used to mathematically derive the output impedance of the output stage).

$Z_{OL}$ represents the open-loop output impedance of the portion of the output stage (of FIG. 3) that is shown in FIG. 4.

$Z_{CL}$ represents the (closed-loop) output impedance of the overall output stage (that is, of the output stage of FIG. 3).

$A_0$ represents the open-loop gain of OPAMP 360.

$A_{PMOS}$ represents the gain due to PMOS transistors 330 and 310.

$V_{in}$ represents the voltage of a voltage source (510 in FIG. 5) connected at terminal 333. (This is used to mathematically derive the gain due to PMOS transistors 330 and 310).

Open-loop output impedance of the portion of the output stage shown in FIG. 4 is given by:

$$Z_{OL}=V_0/I_{in} \quad \text{Equation 5}$$

Applying Kirchoff(s Current law (KCL) at terminal 385 gives:

$$V_0 g_{ds1}+V_0 g_{dsb1}+V_x g_{m1}+(V_0-V_x)g_{ds2}-V_x g_{m2}+I_{in}=0 \quad \text{Equation 6}$$

Applying KCL at terminal 313 gives:

$$V_1 g_{ds2}+V_x g_{m2}-(V_0-V_x)g_{ds2}=0 \quad \text{Equation 7}$$

Rearranging the terms in equation 7 gives:

$$V_0 = \frac{V_x(g_{m2} + g_{ds2} + g_{dsb2})}{g_{ds2}} \quad \text{Equation 8}$$

Substitution of term $V_x$ (obtained from equation 8) in equation 6 gives:

$$\frac{I_{in}}{V_0} = (g_{ds1} + g_{dsb1} + g_{ds2}) + g_{m1}\frac{1-(g_{m2}/g_{m1})-(g_{ds2}/g_{m1})}{1+(g_{m2}/g_{dsb1})} \quad \text{Equation 9}$$

Terms containing $G_{ds1}$ and $G_{ds2}$ can be neglected as they are very small.

Therefore, $Z_{OL}$ may be approximated by the relation below.

$$Z_{OL} \approx \frac{1}{g_{m1}}\frac{1+(g_{m2}/g_{dsb1})}{1-(g_{m2}/g_{m1})} \quad \text{Equation 10}$$

wherein the term $$\frac{1+(g_{m2}/g_{dsb1})}{1-(g_{m2}/g_{m1})}$$

can be considered a scaling factor which is represented for convenience as P.

$Z_{OL}$ thus computed is in turn used for computing the closed loop output impedance of the output stage. The closed-loop output impedance $Z_{CL}$ also depends on the open loop gain of the output stage. Accordingly, the description is continued with respect to the computation of the open loop gain.

Figure 5:
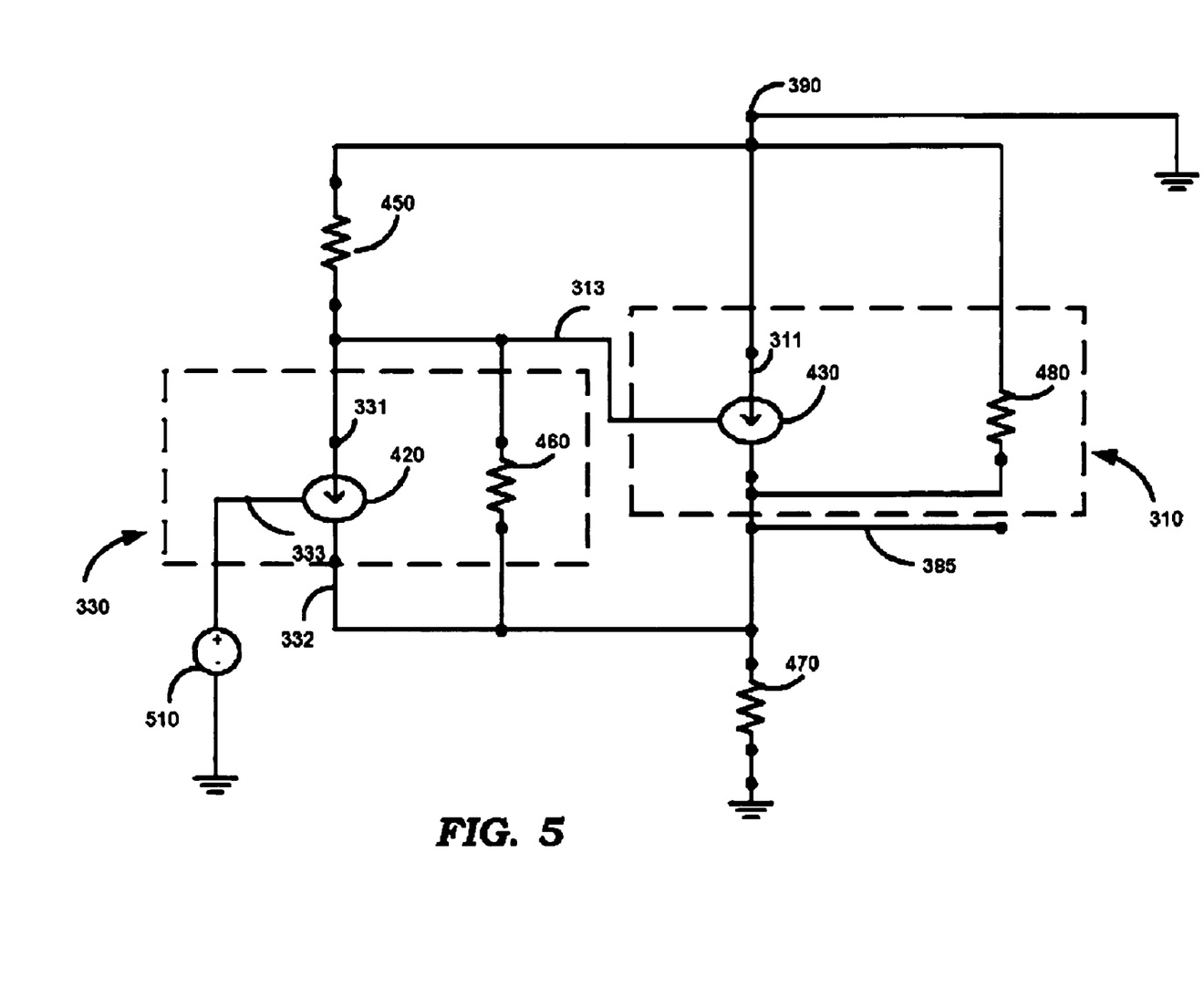
FIG. 5 is a schematic diagram illustrating the manner in which the gain in a output stage due to the PMOS transistors can be computed.

FIG. 5 is a schematic diagram illustrating the manner in which gain (from terminal 363 to 385 of FIG. 3) due to PMOS 330/310 of the circuit of FIG. 3 is computed. The gain thus computed is then used to compute the open loop gain of the output stage. The diagram is described in comparison to the circuit of FIG. 4 for conciseness. The circuit of FIG. 5 differs from the circuit of FIG. 4 in that voltage source 510 supplying $V_{in}$ volts is connected between gate terminal of PMOS 330 and ground, and current source 410 is removed.

The open-loop output impedance ($Z_{OL}$) of the output stage is represented by equation 10.

The closed-loop output impedance of the output stage (that is, of the circuit of FIG. 3) further depends on the total open-loop gain in the output stage (gain in OPAMP+gain due to PMOS transistors 330 and 310).

To derive the gain $A_{PMOS}$ due to PMOS transistors 330 and 310, a voltage $V_{in}$ is applied between terminal 333 and ground, and an expression for the gain $A_{PMOS}$ (which is equal to $V_0/V_{IN}$) is computed as shown below:

Applying KCL at terminal 333:

$$(V_x-V_0)g_{ds2}+V_x g_{dsb2}-(V_{in}-V_x)g_{m2}=0 \quad \text{Equation 11}$$

Applying KCL at terminal 385:

$$V_0 g_{dsd1}+V_0 g_{ds1}+V_x g_{m1}+(V_0-V_x)g_{ds2}+(V_{in}-V_x)g_{m2}=0 \quad \text{Equation 12}$$

Rearranging the terms in equation 11, gives $$V_x = \frac{V_0 g_2 + V g_1}{g_1 + g_2 + g_1} \quad \text{Equation 13}$$

Substitution of term $V_x$ (obtained from equation 13) in equation 12 gives:

$$\frac{V_0}{V_{in}} = \frac{g}{\left[\frac{g+g}{g} \times \frac{g+g+g}{2g-g} + 1\right] \times g} \quad \text{Equation 14}$$

Wherein, $V_0/V_{in}$ of equation 14 represents the gain $A_{PMOS}$ due to PMOS 330 and 310.

If the terms $g_{m1}$ is much greater than $g_{m2}$ and if the $g_{ds}$ terms are much less than the $g_m$ terms, then it may be shown that gain due to PMOS transistors 330 and 310 is substantially the same as factor P of equation 10.

Therefore $A_{PMOS}$=P (approximately) \quad Equation 15a

Due to feedback used:

$$Z_{CL} = Z_{OL}/(G_{OLT}) \quad \text{Equation 15}$$

wherein $G_{OLT} = A_0 * A_{PMOS}$

Substituting the values for $Z_{OL}$ (from equation 10) and $G_{OLT}$ $$Z_{CL} = ((1/g_{m1})*P)/(A_0*P) \quad \text{Equation 16}$$

wherein approximation of equation 15a has been used.

Therefore the (closed-loop) impedance of the output stage may be approximated by $$Z_{CL} = 1/(g_{m1}*A_0) \quad \text{Equation 17}$$

As terms $g_{m1}$ and $A_0$ typically have very large values, it may be seen that the impedance of the output stage is very low.

It must be understood that the above computation of $Z_{CL}$ has been approximated to show that the closed loop output impedance is at least as low as that of the source follower structure of FIG. 2. The actual closed-loop output impedance $Z_{CL}$ of the circuit of FIG. 3 may be shown to be even lower than that of the source follower of FIG. 2.

Thus, the output stage of FIG. 3 operates from a low power supply and has a low output impedance.

The output stage of FIG. 3 may be used as an output stage of voltage generator 110 (shown in FIG. 1), where a stable DC voltage is a requirement. Frequently, there are requirements in electronic circuits where a low-output impedance output stage has to drive a predominantly capacitive load. In such environments, the output signal of interest is typically an AC voltage.

From equation 15, it may be seen that the output impedance $Z_{CL}$ of the output stage is inversely proportional to the open-loop gain $A_0$ of OPAMP 360. This gain $A_0$ is not a constant, but varies inversely as frequency of the input signal (operating frequency) applied to OPAMP 360 (on path 365). Therefore it can be seen that output impedance $Z_{CL}$ of the output stage increases with increasing operating frequency. Thus, $Z_{CL}$ behaves similar to an inductor.

When it is a requirement that the output stage of FIG. 3 be connected to a predominantly capacitive load (such as in a switched capacitor load in an ADC), there is a possibility of resonance occurring in the output signal of the output stage. It is therefore desirable that the output impedance $Z_{CL}$ of the output stage not increase in value significantly as frequency increases.

An aspect of the present invention addresses such a requirement, as is described below.

7. Feedback Capacitor

As noted above, $Z_{CL} = Z_{OL}/(G_{OLT})$ wherein $G_{OLT} = A_0 * A_{PMOS}$ $A_{PMOS}$ represents the gain contribution due to PMOS 330 and PMOS 310. As the operating frequency increases $A_0$ decreases (due to capacitance inherent in various stages in the OPAMP, as is well known in the relevant arts), thereby causing an increase in $Z_{CL}$.

If $Z_{OL}$ is designed to decrease with increasing frequency by ensuring that the feedback from terminal 385 to 313 increases with increasing frequencies, the local loop gain (from terminal 363 to 385) increases, thus resulting in lower overall impedance $Z_{CL}$. This is achieved according to an aspect of the present invention by connecting capacitor 325 between the output terminal 385 of the output stage and the gate terminal 313 of PMOS 310.

As is well known, a capacitor presents a smaller impedance at higher frequencies. As operating frequency increases, capacitor 325 effectively presents a lower impedance and consequently the feedback factor reduces.

This causes more output to be fedback to the gate of PMOS 310, consequently reducing $Z_{OL}$, which offsets, to a degree, a decrease in $A_0$. Therefore, any increase in the value of the term $Z_{OL}$ is minimized, thereby minimizing any change in the output impedance $Z_{CL}$ of the output stage, and thereby minimizing any possibility of resonance occurring in the output signal of the output stage Thus, the connection of capacitor 325 from the output terminal of the output stage to the input terminal of PMOS310 results in an output stage whose output impedance remains low even at higher frequencies.

The description is continued with respect to an example device in which various aspects of the present invention are implemented.

8. Device

Figure 6:
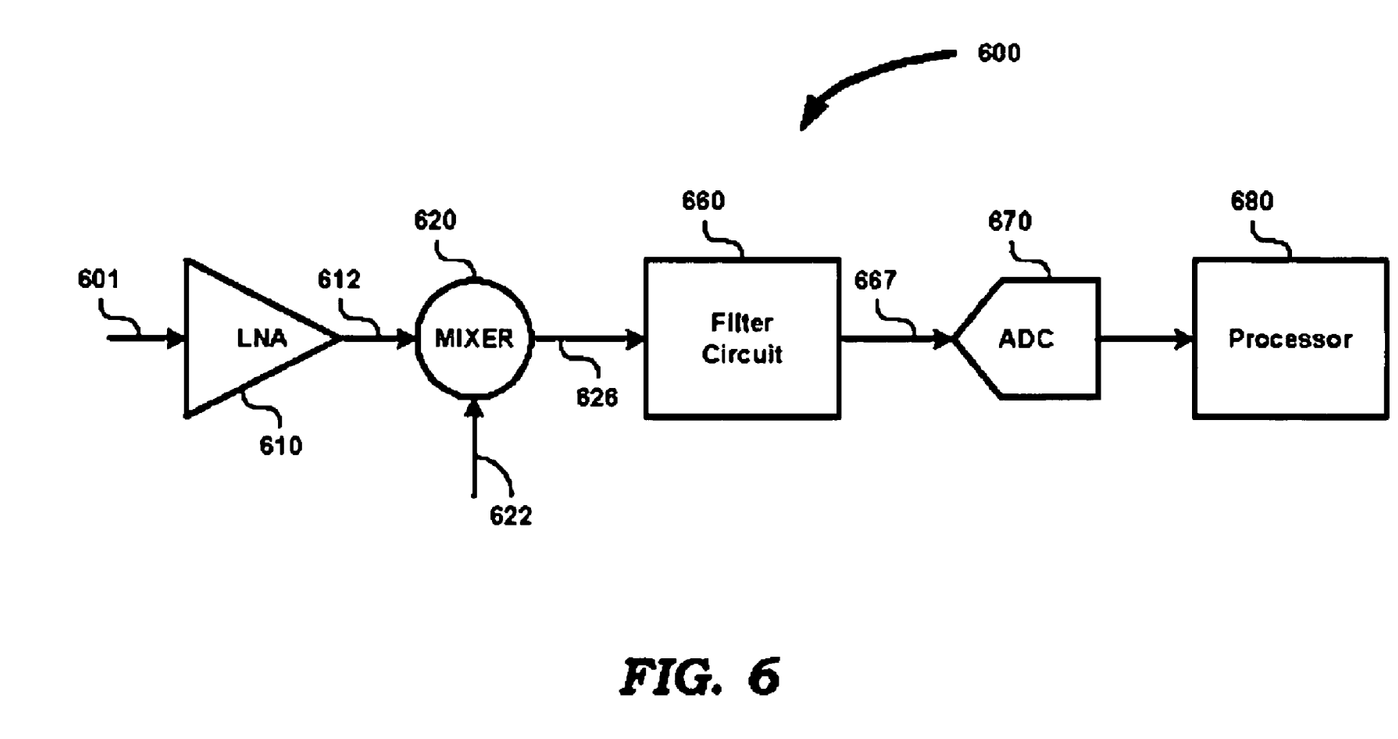
FIG. 6 is a block diagram of a receiver system illustrating an example device in which various aspects of the present invention may be implemented.

FIG. 6 is a block diagram of receiver system 600 illustrating an example system in which various aspects of the present invention may be implemented. For illustration, it is assumed that receiver system 600 is implemented within a Wireless Receiver. However, receiver system 600 can be implemented in other devices (wireless as well as wire-based communications) as well.

Receiver system 600 is shown containing low noise amplifiers (LNA) 610, mixer 620, filter circuit 660, analog to digital converter (ADC) 670, and processor 680. Each block/stage is described in further detail below.

LNA 610 receives signals on path 601 and amplifies the received signals to generate a corresponding amplified signal on path 612. For example, in wireless systems, the signals that are transmitted from satellites, etc. may be received by an antenna (not shown) and the received signals are provided on path 601. The received signals may be weak in strength and thus amplified by LNA 610 for further processing. LNA 610 may be implemented in a known way.

Mixer 620 may be used to down-convert the received amplified signal on path 612 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 620 may receive the amplified signal on path 612 and a signal of fixed frequency on path 622 as inputs, and provides the intermediate signal on path 626. The signal of fixed frequency on path 622 may be generated by a phase locked loop (not shown) in a known way.

Filter circuit 660 may correspond to a low pass filter, which allows the desired low frequencies and rejects all other unwanted high frequencies present in the signal received on line 626. The filtered signal, which contains the frequency band of interest, is provided on path 667.

ADC 670 converts (samples) the filtered signal received on path 667 to a corresponding digital value, which represents the signal of interest in received signal 601. Processor 680 processes the received digital values to provide various user applications and may be implemented as multiple processing units, each potentially operating independently. ADC 670 may correspond to the ADCs described in sections above (and implemented according to various aspects of the present invention).

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A low output impedance output stage providing an output signal on an output terminal, said output stage comprising:

an amplifier comprising an input terminal, and generating an output from an input signal;

a first transistor comprising a gate terminal coupled to receive said output, a second transistor coupled in cascade with the first transistor having a drain terminal coupled to said output terminal, wherein each of said first and second transistors comprises a P-channel metal oxide semiconductor field effect transistor and a source terminal and a bulk terminal of said second transistor are at least at substantially at a same potential, wherein said drain terminal of said second transistor is connected to said first transistor to provide a first feedback path, said output terminal of said output stage being coupled to said input terminal of said amplifier to provide another feedback path independent of the first feedback path and having a capacitor provided between said output terminal of said output stage and a gate terminal of said second transistor; and one or more biasing components comprising a first current source and a second current source respectively providing the corresponding operating point for said first transistor and said second transistor.

2. The output stage of claim 1, wherein said amplifier comprises an operational amplifier.

3. An output stage providing an output signal on an output terminal, said output stage comprising:

an operational amplifier comprising an input terminal, and generating an output from an input signal;

a first P-channel metal oxide semiconductor field effect transistor comprising a gate terminal coupled to receive said output, a second P-channel metal oxide semiconductor field effect transistor having a drain terminal coupled to said output terminal, wherein a source terminal and a bulk terminal of said second transistor are at least at substantially at a same potential, wherein said drain terminal of said second transistor is coupled to said first transistor to provide a feedback path, a capacitor provided between said output terminal of said output stage and a gate terminal of said second transistor and said output terminal of said output stage being coupled to said input terminal of said amplifier to provide another feedback path; and one or more biasing components comprising a first current source and a second current source respectively providing the corresponding operating point for said first transistor and said second transistor operating to provide a corresponding operating point for said plurality of transistors; wherein each of said first and second transistors comprises a source terminal, a drain terminal, a substrate terminal and a gate terminal, wherein said gate terminal, said source terminal and said drain terminal of said first transistor are respectively coupled to an output terminal of said operational amplifier, gate terminal of said second transistor and said output terminal of said output stage;

said source terminal of said second transistor is coupled to a power supply;

said substrate terminal of said first transistor is coupled to said source terminal of said first transistor;

said substrate terminal of said second transistor is coupled to said power supply.

4. The output stage of claim 3, wherein said first current source is provided between said power supply and said source terminal of said first transistor, wherein said second current source is provided between said output terminal of said output stage and a constant bias.

5. The output stage of claim 4, further comprising:

a first impedance provided between said output terminal of said output stage and a non-inverting terminal of said operational amplifier, a second impedance provided between said non-inverting terminal of said operational amplifier and said constant bias.

6. A device comprising:

a processing block processing an output signal received on an output terminal; and a low impedance output stage providing said output signal on said output terminal, said output stage comprising:

an amplifier comprising an input terminal, and generating an output from an input signal;

a first transistor comprising a gate terminal coupled to receive said output, a second transistor coupled in cascade with the first transistor having a drain terminal coupled to said output terminal, wherein a source terminal and a bulk terminal of said second transistor are at least at substantially at a same potential wherein said first transistor and said second transistor comprises a P-channel metal oxide semiconductor field effect transistor and wherein a capacitor is provided between said output terminal and a gate terminal of said second transistor, wherein said drain terminal of said second transistor is connected to said first transistor to provide a feedback path, said output terminal of said output stage being coupled to said input terminal of said amplifier to provide another feedback path independent of the first feedback path; and one or more biasing components comprising a first current source and a second current source respectively providing the corresponding operating point for said first transistor and said second transistor, wherein said output stage is a low impedance output stage contained in a voltage generator which generates a reference voltage such that said output signal comprises said reference voltage.

7. The device of claim 6, wherein said processing block comprises:

an analog to digital converter (ADC) receiving an input signal and generating a plurality of digital codes from said input signal; and a processor processing said plurality of digital codes.

8. The device of claim 7, further comprising:

an low noise amplifier receiving an external signal and amplifying said external signal to generate an amplified signal;

a mixer down-converting said amplified signal to a pre-specified band;

a filter removing undesired frequency components pre-specified band to generate said input signal.

9. The device of claim 6, wherein said amplifier comprises an operational amplifier.

10. The device of claim 9, wherein each of said first transistor and said second transistor comprises a source terminal, a drain terminal, a substrate terminal and a gate terminal, wherein said gate terminal, said source terminal and said drain terminal of said first transistor are respectively coupled to an output terminal of said operational amplifier, gate terminal of said second transistor and said output terminal of said output stage;

said source terminal of said second transistor is coupled to a power supply;

said substrate terminal of said first transistor is coupled to said source terminal of said first transistor;

said substrate terminal of said second transistor is coupled to said power supply.

11. The device of claim 10, wherein said first current source is provided between said power supply and said source terminal of said first transistor, wherein said second current source is provided between said output terminal of said output stage and a constant bias.

12. The device of claim 11, wherein said output stage further comprises: a first impedance provided between said output terminal of said output stage and a non-inverting terminal of said operational amplifier; and a second impedance provided between said non-inverting terminal of said operational amplifier and said constant bias.

13. An output stage providing an output signal on an output terminal, said output stage comprising:

an operational amplifier having an inverting terminal, a non-inverting terminal and an output terminal;

a first transistor and a second transistor, wherein each of said first transistor and said second transistor comprises a source terminal, a gate terminal, a drain terminal, and a substrate terminal;

a first current source coupled between the source terminal of said first transistor and a power supply terminal;

a second current source coupled between the drain terminal of said second transistor and a constant bias;

a capacitor coupled between the drain terminal of said second transistor and the gate terminal of said second transistor;

said gate terminal of said first transistor being coupled to said output terminal of said operational amplifier, said source terminal of said first transistor being coupled to said gate terminal of said second transistor, said output terminal of said output stage is coupled to said drain terminal of said second transistor, said source terminal of said second transistor being coupled to said power supply terminal, said output terminal of said output stage being coupled to said non-inverting terminal of said operational amplifier, said output terminal of said output stage also being coupled to said drain terminal of said first transistor, and said substrate terminal of each of said first transistor and said second transistor is coupled to said power supply terminal.

* * * * *